(12) United States Patent
Kikuchi et al.

(10) Patent No.: US 9,859,340 B2
(45) Date of Patent: Jan. 2, 2018

(54) ORGANIC ELECTROLUMINESCENT DISPLAY DEVICE HAVING BENT TYPE OR CURVED SURFACE TYPE DISPLAY

(71) Applicant: Sharp Kabushiki Kaisha, Sakai, Osaka (JP)

(72) Inventors: Katsuhiro Kikuchi, Sakai (JP); Yoshiyuki Isomura, Sakai (JP); Yuto Tsukamoto, Sakai (JP); Manabu Niboshi, Sakai (JP); Shinichi Kawato, Sakai (JP); Satoshi Inoue, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/315,733

(22) PCT Filed: Jun. 3, 2015

(86) PCT No.: PCT/JP2015/066068
§ 371 (c)(1),
(2) Date: Dec. 2, 2016

(87) PCT Pub. No.: WO2015/186748
PCT Pub. Date: Dec. 10, 2015

(65) Prior Publication Data
US 2017/0117333 A1    Apr. 27, 2017

(30) Foreign Application Priority Data

Jun. 4, 2014  (JP) .................................. 2014-115783

(51) Int. Cl.
*H01L 51/50* (2006.01)
*H01L 27/32* (2006.01)
(Continued)

(52) U.S. Cl.
CPC ............ *H01L 27/3213* (2013.01); *G09F 9/30* (2013.01); *H01L 51/0096* (2013.01);
(Continued)

(58) Field of Classification Search
CPC ............ H01L 51/5012; H01L 51/5036; H01L 51/5052; H01L 51/5056; H01L 51/5072;
(Continued)

(56) References Cited

U.S. PATENT DOCUMENTS 6,259,846 B1    7/2001  Roach et al.
2008/0024402 A1  1/2008  Nishikawa et al.
(Continued)

FOREIGN PATENT DOCUMENTS

JP    2002-543446 A    12/2002
JP    2010-153284 A     7/2010
(Continued)

OTHER PUBLICATIONS

Official Communication issued in International Patent Application No. PCT/JP2015/066068, dated Aug. 18, 2015.

*Primary Examiner* — Hoai V Pham
(74) *Attorney, Agent, or Firm* — Keating & Bennett, LLP

(57) ABSTRACT

An organic electroluminescent display device of the present invention includes: a substrate; an anode (first electrode); an organic layer including a light-emitting layer; a cathode (second electrode); a reflective layer and a semi-transmissive reflective layer provided to interpose an organic layer; and a plurality of sub-pixels of different colors in which light emitted from the organic layer is repeatedly reflected between the reflective layer and the semi-transmissive reflective layer such that light of a specific wavelength is enhanced and emitted. The substrate is bent or curved, and an optical path length between the reflective layer and the cathode (semi-transmissive reflective layer) in a sub-pixel of
(Continued)

a predetermined color of a flat region (first region) is different from an optical path length between the reflective layer and the cathode (semi-transmissive reflective layer) in a sub-pixel of a same color as the predetermined color of a bent region (second region).

14 Claims, 14 Drawing Sheets

(51) Int. Cl.
    *G09F 9/30* (2006.01)
    *H01L 51/52* (2006.01)
    *H01L 51/00* (2006.01)
(52) U.S. Cl.
    CPC ...... *H01L 51/5088* (2013.01); *H01L 51/5206* (2013.01); *H01L 51/5265* (2013.01); *H01L 51/5271* (2013.01); *H01L 51/5218* (2013.01); *H01L 2251/558* (2013.01)

(58) Field of Classification Search
    CPC ............. H01L 51/5088; H01L 51/5218; H01L 27/3216; H01L 27/3218; H01L 27/322
    See application file for complete search history.

(56) References Cited

U.S. PATENT DOCUMENTS

| 2008/0143649 | A1 | 6/2008 | Asaki et al. |
| 2010/0164842 | A1 | 7/2010 | Ishihara et al. |
| 2016/0072066 | A1* | 3/2016 | Lee ................... H01L 51/0013 438/35 |

FOREIGN PATENT DOCUMENTS

| JP | 2010-238677 A | 10/2010 |
| JP | 2011-165621 A | 8/2011 |
| WO | 2005/107327 A1 | 11/2005 |

* cited by examiner

ORGANIC ELECTROLUMINESCENT DISPLAY DEVICE HAVING BENT TYPE OR CURVED SURFACE TYPE DISPLAY

TECHNICAL FIELD

The present invention relates to an organic electroluminescent display device.

Priority is claimed on Japanese Patent Application No. 2014-115783, filed Jun. 4, 2014, the content of which is incorporated herein by reference.

BACKGROUND ART

In an organic electroluminescent display device, a structure in which light emitted from a light-emitting layer is multiply-reflected between a pair of reflective layers to resonate, a so-called microcavity structure, has been proposed to improve color purity and efficiency in extracting light. If light resonates between the pair of reflective layers, there are effects that an emission spectrum becomes steep and light intensity of a peak wavelength is increased. For example, in Patent Document 1 below, an organic light-emitting display device which includes a bottom electrode, a top electrode, and a dielectric alternate laminated film, and has the microcavity structure configured of the dielectric alternate laminated film and the bottom electrode is disclosed. "Electroluminescent" is hereinafter abbreviated as "EL."

PRIOR ART DOCUMENTS

Patent Document

[Patent Document 1] Japanese Patent Application Publication No. 2010-153284

SUMMARY OF THE INVENTION

Problem to be Solved by the Invention

In recent years, use forms and installation environments of displays have diversified in the field of displays, and not only planar displays but also displays in bent shapes or displays curved in curved surface shapes are provided. Since organic EL display devices are self-luminous displays that do not require an external light source, organic EL display devices are expected to be developed into bent type or curved surface type displays. However, if an organic EL display device having the microcavity structure described above is applied to a bent type or curved surface type display, there is a problem that brightness or chromaticity of a displayed image is lowered.

One aspect of the present invention is made to solve the above problems, and provides a bent type or curved surface type organic EL display device which can suppress a lowering of the brightness or the chromaticity of a displayed image.

Means for Solving the Problems

To achieve the above-described object, an organic electroluminescent display device according to one aspect of the present invention includes: a substrate; a first electrode provided on the substrate; an organic layer including a light-emitting layer provided above the first electrode on the substrate; a second electrode provided above the organic layer on the substrate; a reflective layer and a semi-transmissive reflective layer provided to interpose the organic layer on the substrate; and a plurality of sub-pixels of different colors in which light emitted from the organic layer is repeatedly reflected between the reflective layer and the semi-transmissive reflective layer such that light of a specific wavelength is enhanced and emitted; wherein the substrate has at least a first region in which a normal direction of a display surface faces a first direction and a second region in which a normal direction of the display surface faces a second direction different from the first direction by being bent or curved, and an optical path length between the reflective layer and the semi-transmissive reflective layer in a sub-pixel of a predetermined color of the first region is different from an optical path length between the reflective layer and the semi-transmissive reflective layer in a sub-pixel of a same color as the predetermined color of the second region.

In the organic electroluminescent display device according to one aspect of the present invention, the organic layer may include a hole injection layer, and a layer thickness of the hole injection layer in the first region may be different from a layer thickness of the hole injection layer in the second region such that the optical path length in the first region is different from the optical path length in the second region.

In the organic electroluminescent display device according to one aspect of the present invention, when the optical path length in the first region is set as tr1 and the optical path length in the second region is set as tr2, it may be tr1<tr2, and when the layer thickness of the hole injection layer in the first region is set as tHIL1 and the layer thickness of the hole injection layer in the second region is set as tHIL2, it may be tHIL1<tHIL2.

In the organic electroluminescent display device according to one aspect of the present invention, the first electrode may include a transparent electrode layer, and a layer thickness of the transparent electrode layer in the first region may be different from a layer thickness of the transparent electrode in the second region such that the optical path length in the first region is different from the optical path length in the second region.

In the organic electroluminescent display device according to one aspect of the present invention, when the optical path length in the first region is set as tr1 and the optical path length in the second region is set as tr2, it may be tr1<tr2, and when the layer thickness of the transparent electrode layer in the first region is set as tITO1 and the layer thickness of the transparent electrode layer in the second region is set as tITO2, it may be tITO1<tITO2.

In the organic electroluminescent display device according to one aspect of the present invention, a light-emitting layer that emits light of a color corresponding to a sub-pixel of a predetermined color may be provided in the sub-pixel among the plurality of sub-pixels of different colors.

In the organic electroluminescent display device according to one aspect of the present invention, optical path lengths between the reflective layer and the semi-transmissive reflective layer corresponding to the sub-pixels of different colors may be different from each other.

In the organic electroluminescent display device according to one aspect of the present invention, a plurality of light-emitting layers that emit light of different colors may be commonly provided over the plurality of sub-pixels, and optical path lengths between the reflective layer and the semi-transmissive reflective layer corresponding to the sub-pixels of different colors may be different from each other.

In the organic electroluminescent display device according to one aspect of the present invention, the organic layer may include a hole injection layer, and a layer thickness of the hole injection layer may be different for each of the sub-pixels of different colors such that an optical path length is different for each of the sub-pixels of different colors.

In the organic electroluminescent display device according to one aspect of the present invention, the first electrode may include a transparent electrode layer, and a layer thickness of the transparent electrode layer may be different for each of the sub-pixels of different colors such that an optical path length is different for each of the sub-pixels of different colors.

In the organic electroluminescent display device according to one aspect of the present invention, the substrate may be curved, and the optical path length in a central region of the substrate may be different from the optical path length in a peripheral region of the substrate.

In the organic electroluminescent display device according to one aspect of the present invention, when the optical path length in a central region of the substrate corresponding to the first region is set as tr1, the optical path length in an intermediate region corresponding to the second region, which is a region between the peripheral region and the central region of the substrate, is set as tr2, and the optical path length in the peripheral region of the substrate corresponding to a third region is set as tr3, it may be tr1<tr2<tr3, and the organic layer may include a hole injection layer, and when a layer thickness of the hole injection layer in the first region is set as tHIL1, a layer thickness of the hole injection layer in the second region is set as tHIL2, and a layer thickness of the hole injection layer in the third region may be set as tHIL3, tHIL1<tHIL2<tHIL3.

Effect of the Invention

According to one aspect of the present invention, a bent type or a curved surface type organic EL display device which can suppress a lowering of the brightness or the chromaticity of a displayed image can be obtained.

BRIEF DESCRIPTIONS OF THE DRAWINGS

EMBODIMENTS FOR CARRYING OUT THE INVENTION

First Embodiment

Hereinafter, a first embodiment of the present invention will be described using FIGS. 1 to 6C.

An organic EL display device of the first embodiment is an example of a top-emission type organic EL display device in which a microcavity structure is adopted.

Components may be shown with different scales of size in the attached drawings so that all components are easily visible.

Figure 1:
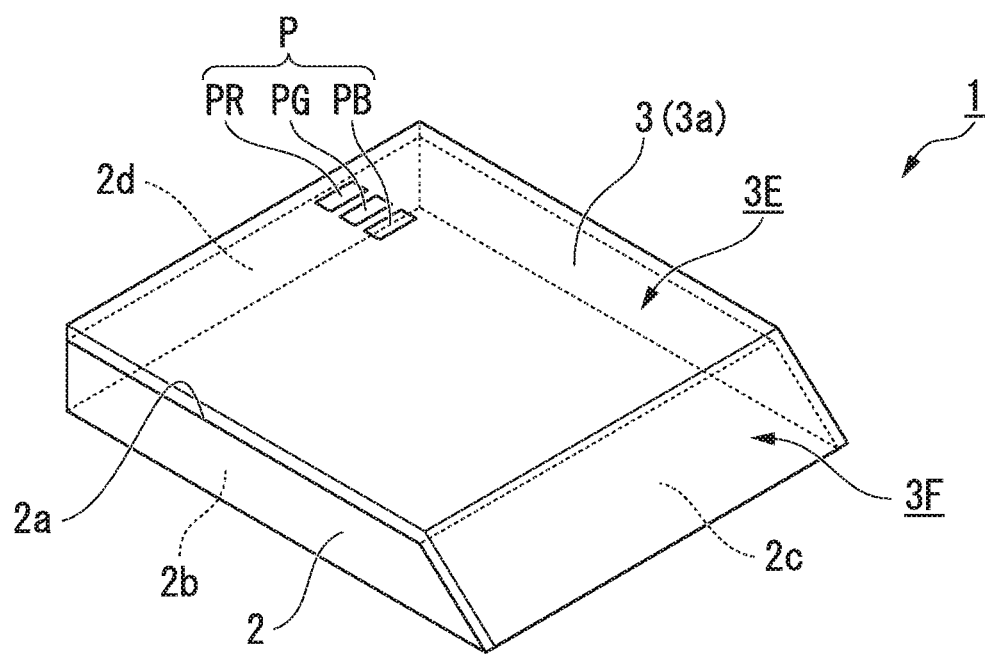
FIG. 1 is a perspective view which shows an organic EL display device according to a first embodiment of the present invention.
Figure 2A:
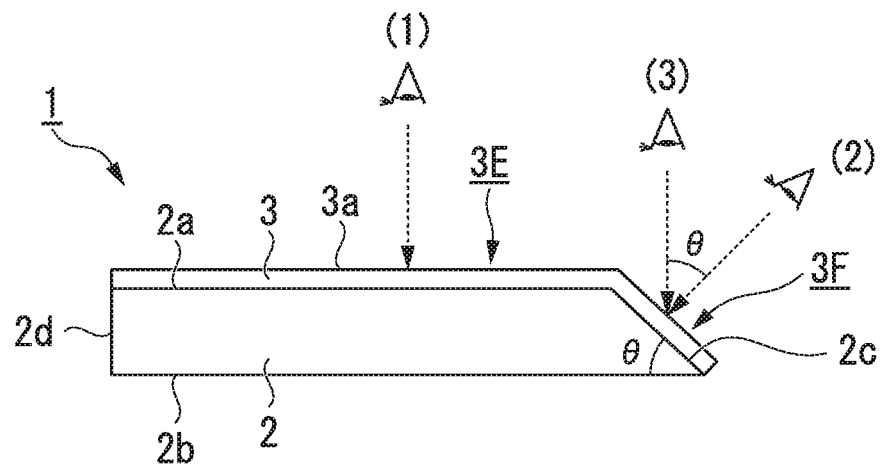
FIG. 2A is a side view of the organic EL display device.

As shown in FIGS. 1 and 2A, an organic EL display device 1 of the present invention includes a housing 2 and an organic EL panel 3. The housing 2 is in a rectangular plate shape, and has two main surfaces and four end surfaces. Three of the four end surfaces are surfaces perpendicular to both main surfaces. The remaining one end surface is an inclined surface that is inclined with respect to both main surfaces. An angle between one of the main surfaces and the inclined end surface is set as θ. The angle θ is an acute angle.

A use form of the organic EL display device 1 is not particularly limited, but the organic EL display device 1 is placed on a desk and the like with a display surface 1a facing upward and the display surface 1a which a user sees from above will be described in the following. For convenience of description, among the two main surfaces of the housing 2, a main surface 2a on an upper side of FIG. 2A is referred to as an "upper surface" and a main surface 2b on a lower side is referred to as a "lower surface." Among the four end surfaces of the housing 2, the inclined end surface 2c is referred to as an "inclined surface," and the remaining three end surfaces 2d are simply referred to as "end surfaces."

The organic EL panel 3 is disposed along the upper surface 2a and the inclined surface 2c of the housing 2 with a display surface 3a facing upward in FIG. 2A. Therefore, the organic EL panel 3 is bent along a line parallel to one side of the inclined surface 2c of the housing 2. The organic EL panel 3 includes a first region 3E in which a normal direction of the display surface 3a faces a vertical direction (a first direction) and a second region 3F in which the normal direction of the display surface 3a faces a direction (a second direction) inclined from the vertical direction. In other words, the first region 3E of the organic EL panel 3 is a region in contact with the upper surface 2a of the housing 2. The second region 3F of the organic EL panel is a region in contact with the inclined surface 2c of the housing 2. Hereinafter, the first region 3E is referred to as a flat region and the second region 3F is referred to as a bent region.

As shown in FIG. 1, a plurality of pixels P are formed in a matrix form on the display surface 3a of the organic EL panel 3. Any of images or characters is displayed by the plurality of pixels P. One pixel P is configured of three sub-pixels including a red (R) sub-pixel PR, a green (G) sub-pixel PG, and a blue (B) sub-pixel PB.

In general, in the top-emission type organic EL panel in which the microcavity structure is adopted, a reflective layer on an anode side (lower layer side) and a semi-transmissive reflective layer on a cathode side (upper layer side) are disposed on a substrate, and an organic layer is formed between the anode and the cathode. In this case, each of a constructive wavelength and a destructive wavelength caused by an optical interference effect due to resonance of light is determined by an optical path length of the microcavity structure, that is, a distance between the reflective layer and the semi-transmissive reflective layer.

Figure 3A:
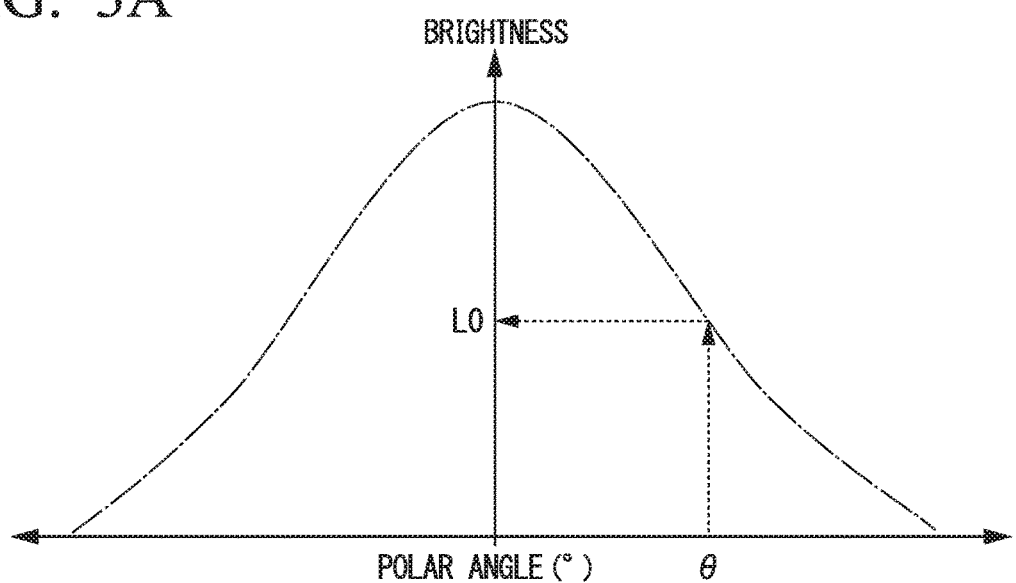
FIG. 3A is a graph which shows viewing angle brightness characteristics of a typical organic EL display device.

For example, when the organic EL panel includes three types of sub-pixels, red (R), green (G), and blue (B), the optical path length of the microcavity structure for each sub-pixel is set so that light of a wavelength corresponding to red is constructive in the R sub-pixel, light of a wavelength corresponding to green is constructive in the G sub-pixel, and light of a wavelength corresponding to blue is constructive in the B sub-pixel. In this case, it is usual that the optical path length is optimized on a premise that light travels in a normal direction of the organic EL panel, that is, a forward direction from a display surface. General viewing angle characteristics of this type of organic EL panel are as shown in FIG. 3A. The viewing angle characteristics have a peak at which brightness at a time when a polar angle is 0°, that is, brightness in the forward direction of the organic EL panel, is the highest.

If a planar organic EL panel is relatively small, for example, for mobile applications, a user may view an entire region of a display surface from substantially the same angle when a viewpoint is fixed. On the other hand, in the case of a bent type organic EL panel, a user may view regions of a display surface from different angles even when a viewpoint is fixed. In the case of the present embodiment, as shown in FIG. 2A, when a viewer views a display surface 3a in the forward direction of the organic EL panel 3, he or she views an image of the flat region 3E in the forward direction and views an image of the bent region 3F in a direction inclined from the forward direction by an angle θ.

Figure 2B:
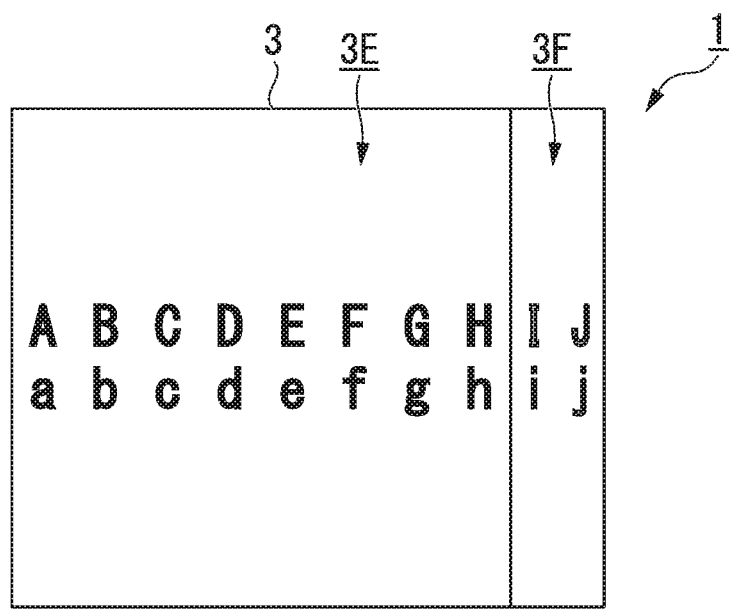
FIG. 2B is a plan view of the organic EL display device.

Here, since an optical path length is optimized with respect to the forward direction of the display surface 3a in an entire region of the organic EL panel 3, when an image of the flat region 3E is viewed from a normal direction (a direction of (1) of FIG. 2A) of the flat region 3E, there is no problem of lowering brightness or chromaticity of an image. When an image of the bent region 3F is also viewed from a normal direction (a direction of (2) of FIG. 2A) of the bent region 3F, there is no problem of lowering brightness or chromaticity of an image. However, when an image of the bent region 3F is viewed together with the flat region 3E in the same direction (a direction of (3) of FIG. 2A), an optical path length of the microcavity structure in the bent region 3F is not optimized with respect to the direction, and an optical interference condition is not satisfied. As a result, as shown in FIG. 2B, there are problems that brightness or chromaticity of the bent region 3F is lowered and visibility of an entire image is lowered.

Figure 3B:
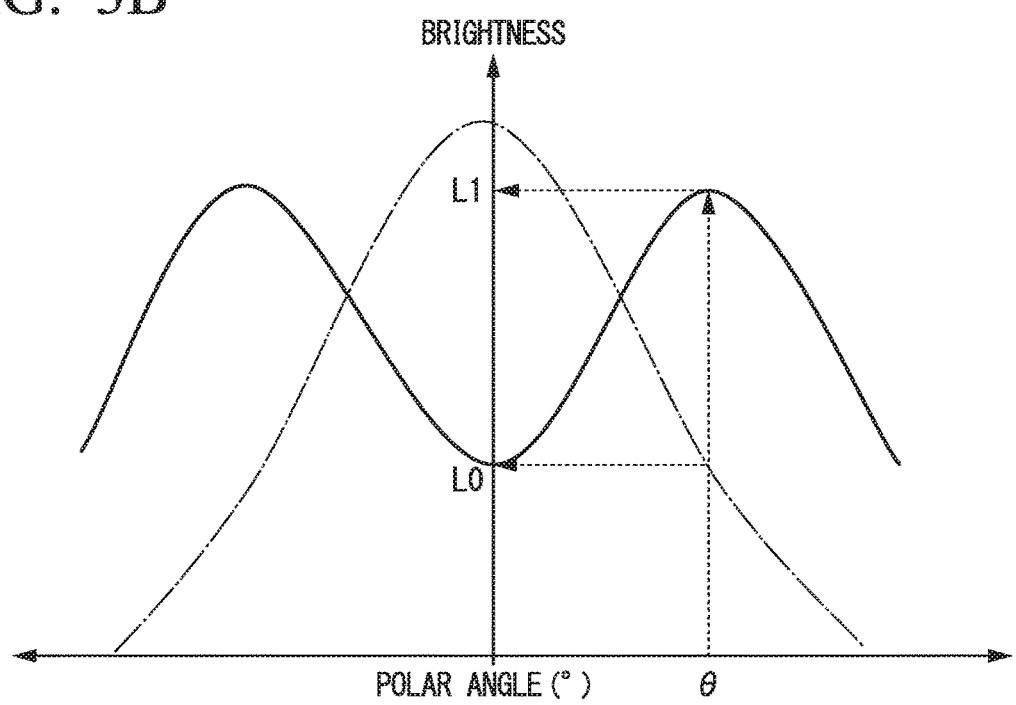
FIG. 3B is a graph which shows viewing angle brightness characteristics of the organic EL display device of the present embodiment.

In the organic EL panel 3 of the embodiment, in order to prevent such problems, optical path lengths of the microcavity structure corresponding to sub-pixels of the same color in the flat region 3E and the bent region 3F are made to be different from each other. At this time, viewing angle characteristics of the organic EL panel 3 are as shown in FIG. 3B. A graph indicated by a dashed line in FIG. 3B represents viewing angle characteristics in the flat region 3E, and a graph indicated by a solid line represents viewing angle characteristics in the bent region 3F. If such viewing angle characteristics are realized, brightness at a time when a display of the bent region 3F is viewed at the angle θ, that is, at a time when the bent region 3F is viewed in the forward direction of the flat region 3E, can be increased from L0 to L1.

Hereinafter, the detailed content will be described using FIGS. 4, 5A, and 5B.

Figure 4:
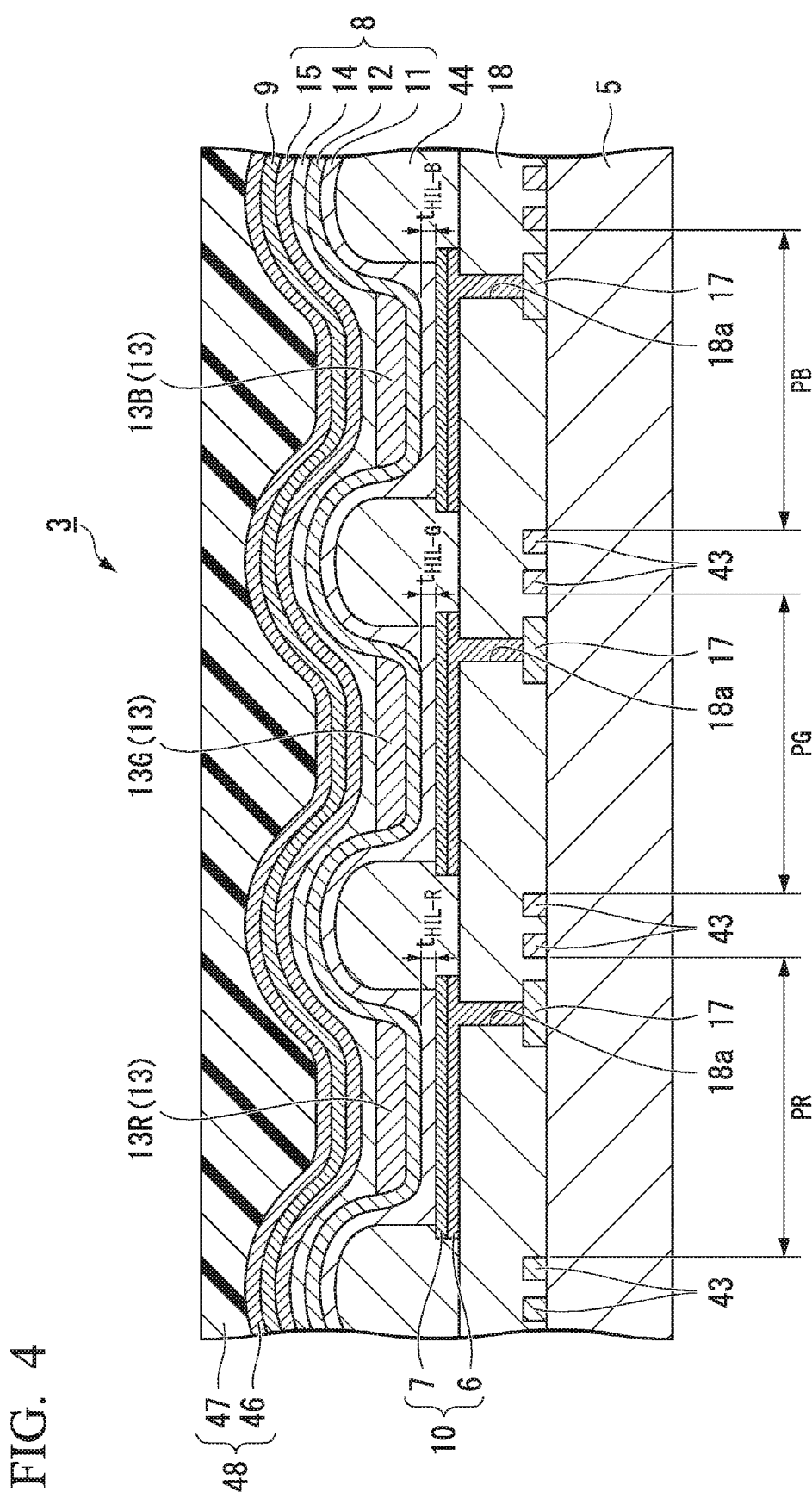
FIG. 4 is a cross-sectional view of a flat region of the organic EL display device.

FIG. 4 is a cross-sectional view of the flat region 3E of the organic EL panel 3. FIG. 4 shows a configuration of three R, G, and B sub-pixels.

Figure 5A:
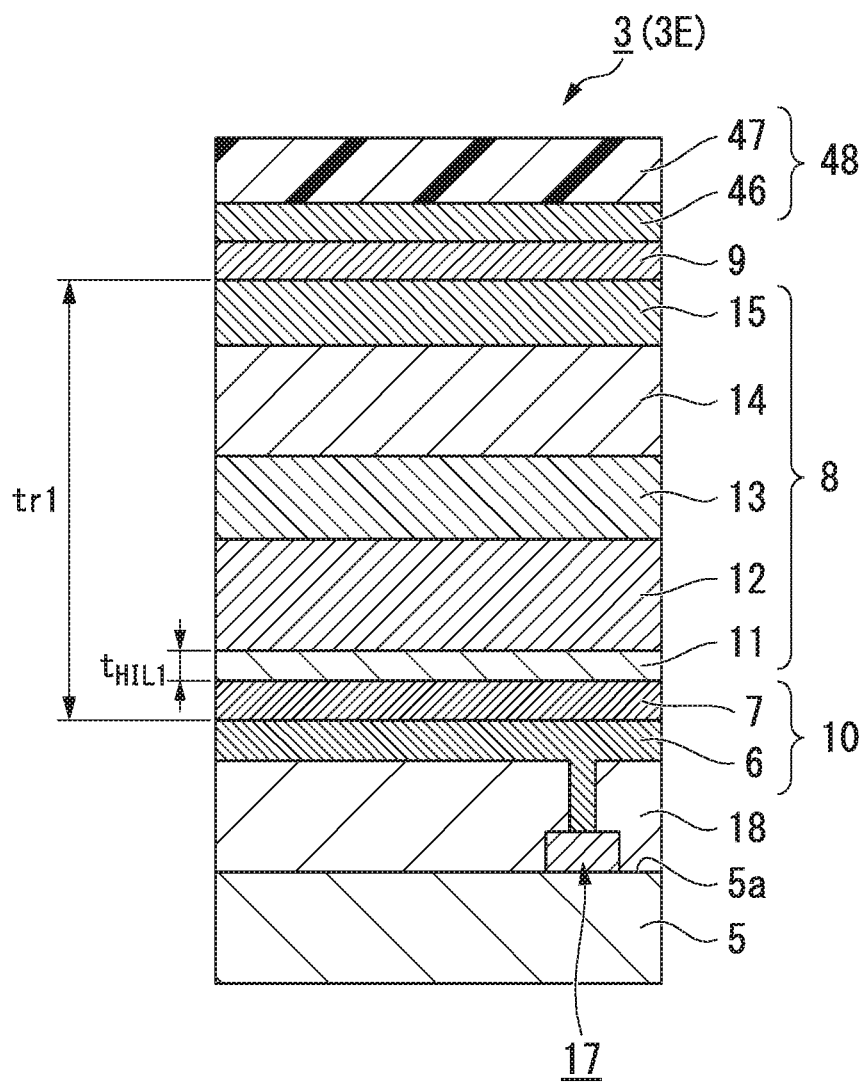
FIG. 5A is a cross-sectional view of a flat region of an organic EL panel.

FIG. 5A is a cross-sectional view of the flat region 3E of the organic EL panel 3. FIG. 5B is a cross-sectional view of the bent region 3F. In FIGS. 5A and 5B, the R sub-pixel among the three sub-pixels is representatively shown. The G sub-pixel and the B sub-pixel have different absolute values of the layer thickness from the R sub-pixel, but the size relationship of the layer thicknesses remains the same.

As shown in FIG. 4, the organic EL panel 3 includes a substrate 5, a reflective layer 6, a transparent electrode layer 7, an organic layer 8, a cathode 9, and a protection layer 48. The reflective layer 6 and the transparent electrode layer 7 are sequentially laminated above the substrate 5. The reflective layer 6 and the transparent electrode layer 7 configure an anode 10. On the other hand, the cathode 9 also functions as a semi-transmissive reflective layer. The anode 10 of the embodiment corresponds to a first electrode in the scope of the claims. The cathode 9 of the embodiment corresponds to a second electrode in the scope of the claims.

The organic layer 8 is provided in an upper layer of the transparent electrode layer 7 on a first surface 5a of the substrate 5. The organic layer 8 is configured of a laminated film in which the hole injection layer 11, the hole transport layer 12, the light-emitting layer 13, the electron transport layer 14, and the electron injection layer 15 are laminated from the substrate 5 side. The cathode 9 is provided in an upper layer of the organic layer 8 on the first surface 5a of the substrate 5. In the embodiment, a region between the reflective layer 6 and the cathode 9 configures the microcavity structure, and light emitted from a light-emitting layer 13 is multiply-reflected between the reflective layer 6 and the cathode 9. The protection layer 48 for protecting each layer configuring an organic EL element is provided in an upper layer of the cathode 9.

A substrate having flexibility, such as a plastic substrate, is used for the substrate 5. A thin-film transistor (TFT) 17 is provided for each sub-pixel on the first surface 5a of the substrate 5. Furthermore, a data line, a scanning line, a power supply line (not shown), and the like for supplying a signal to the TFT 17 are provided on the first surface 5a of the substrate 5. An interlayer insulation film 18 is provided on the first surface 5a of the substrate 5 to cover the TFT 17, the data line, the scanning line, the power supply line, and the like. As a material of the interlayer insulation film 18, for example, a resin film such as an acrylic resin and an inorganic film such as a silicon oxide film are used.

The reflective layer 6 and the transparent electrode layer 7 are sequentially laminated on the interlayer insulation film 18. As a material of the reflective layer 6, metals with high light reflectance such as aluminum (Al) and silver (Ag) are used. The reflective layer 6 has a function of reflecting light emitted from the light-emitting layer 13 to the cathode 9 side. As a material of the transparent electrode layer 7, a transparent conductive film such as indium tin oxide (hereinafter, referred to as ITO) is used. The transparent electrode layer 7 has a function of injecting holes into the organic layer 8.

The organic layer 8 includes the hole injection layer 11, the hole transport layer 12, the light-emitting layer 13, the electron transport layer 14, and the electron injection layer 15, and the layers other than the light-emitting layer 13 are appropriately inserted if necessary. In addition, the transport layer and the injection layer may serve as a single layer, and an inorganic film may also be used. In the embodiment, as described above, an organic layer of a five-layer structure of the hole injection layer 11, the hole transport layer 12, the light-emitting layer 13, the electron transport layer 14, and the electron injection layer 15 is exemplified. Furthermore, if necessary, a layer for preventing a charge from moving to an electrode on the other side, such as a hole blocking layer or an electron blocking layer, may also be appropriately added.

The organic layer 8 is formed by a known process. Pattern formation may be performed in vacuum deposition using, for example, a shadow mask, but is not limited thereto, and can be performed using a spray method or an inkjet method, a printing method or a laser transfer method, and the like.

The hole injection layer 11 has a function of increasing hole injection efficiency from the transparent electrode layer 7 into the light-emitting layer 13. The hole transport layer 12 is a layer having a function of increasing hole transport efficiency from the transparent electrode layer 7 to the light-emitting layer 13. Materials of the hole injection layer 11 and the hole transport layer 12 include, for example, benzine, styrylamine, triphenylamine, porphyrin, triazole, imidazole, oxadiazole, polyarylalkanes, phenylenediamine, aryl amines, oxazole, anthracene, fluorenone, hydrazone, stilbene, triphenylene, azatriphenylene, derivatives of these, or a monomer, oligomer, or a polymer of a heterocyclic conjugated base such as a polysilane-based compound, a vinyl-based compound, a thiophene-based compound, or an aniline-based compound. The hole injection layer 11 and the hole transport layer 12 may be integrated or may be formed as independent layers.

The light-emitting layer 13 has a function of emitting light when energy is deactivated by re-combining holes injected from the transparent electrode layer 7 side and electrons injected from the cathode 9 side. The light-emitting layer 13 is formed of a material with high emission efficiency such as a low molecular fluorescent dye, a fluorescent polymer, or a metal complex. A material of the light-emitting layer 13 includes, for example, anthracene, naphthalene, indene, phenanthrene, pyrene, naphthacene, triphenylene, anthracene, perylene, picene, fluoranthene, acephenanthrylene, pentaphene, pentacene, coronene, butadiene, coumarin, acridine, stilbene, derivatives of these, a tris(8-quinolinolato) aluminum complex, a bis(benzoquinolinolato)beryllium complex, a tri(dibenzoyl methyl)phenanthroline europium complex, di-tolyl vinyl biphenyl, or the like.

The electron transport layer 14 has a function of increasing electron transport efficiency from the cathode 9 to the light-emitting layer 13. The electron injection layer 15 has a function of increasing electron injection efficiency from the cathode 9 into the light-emitting layer 13. Materials of the electron transport layer 14 and the electron injection layer 15 include, for example, quinolone, perylene, phenanthroline, bisstyryl, pyrazine, triazole, oxazole, oxadiazole, fluorenone, derivatives of these, metal complexes, or the like. In particular, the materials include tris(8-hydroxyquinoline) aluminum, anthracene, naphthalene, phenanthrene, pyrene, anthracene, perylene, butadiene, coumarin, acridine, stilbene, 1,10-phenanthroline, derivatives of these, metal complexes, and the like. The electron transport layer 14 and the electron injection layer 15 may be integrated or may be formed as independent layers.

The cathode 9 has a function of injecting electrons into the organic layer 8. Metals with low work function and the like, such as Ag, Al, magnesium alloys (MgAg and the like), aluminum alloys (AlLi, AlCa, AlMg, and the like), and metal calcium, are preferably used for the cathode 9. Alternatively, the cathode 9 may be formed as a laminated film of lithium fluoride (LiF)/calcium (Ca)/aluminum (Al) and the like. Moreover, the cathode 9 may be formed as a transparent conductive film such as ITO. A film thickness of the cathode 9 is appropriately adjusted to obtain the characteristic of so-called semi-transmissive reflectivity, in which light is partially transmitted therethrough and partially reflected. In other words, the cathode 9 functions not only as an electrode but also as a semi-transmissive reflective layer. The cathode 9 of the embodiment corresponds not only to a second electrode in the scope of the claims but also to a semi-transmissive reflective layer.

The protection layer 48 is configured of a laminated film of an inorganic layer 46 made of an inorganic material and an organic layer 47 made of an organic material. The protection layer is not limited to the two-layer structure described above, and may have a structure in which, for example, three or more layers are laminated so that the inorganic layer and the organic layer alternately overlap. For the inorganic layer 46, for example, $SiN_x$, SiON, SiOC, $SiO_x$, and the like are used. For the organic layer 47, for example, an epoxy resin, an acrylic resin, and the like are used. In particular, the organic layer 47 also has a function of planarizing a step made by a plurality of films on a lower layer side.

In the organic EL panel 3 of the embodiment, the microcavity structure is adopted, and a top emission type in which light is extracted from a side opposite to the substrate 5 is exemplified, but the organic EL panel is not limited thereto. If the microcavity structure is applied, the organic EL panel may be a bottom emission type in which light is extracted from the substrate 5 side.

The microcavity structure uses resonance of light between the reflective layer 6 and the cathode 9 and has an effect of enhancing light of a specific wavelength. In the embodiment, a light-emitting layer 13R made of a light-emitting material which emits red light is provided in a red (R) sub-pixel PR. In the same manner, a light-emitting layer 13G made of a light-emitting material which emits green light is provided in a green (G) sub-pixel PG. A light-emitting layer 13B made of a light-emitting material which emits blue light is provided in a blue (B) sub-pixel PB. A partition 44 for partitioning light-emitting layers of each of the sub-pixels is provided on the interlayer insulation film 18.

In this manner, since wavelengths of light emitted from light-emitting layers 13R, 13G, and 13B of each of the sub-pixels PR, PG, and PB are different from each other, optical path lengths between the reflective layer 6 and the cathode 9 correspond to emission spectrum peak wavelengths of respective colors. In other words, in the embodiment, since the cathode 9 also serves as a semi-transmissive reflective layer, the optical path lengths between the reflective layer 6 and the semi-transmissive reflective layer correspond to the emission spectrum peak wavelengths of respective colors.

Therefore, the optical path lengths are set so that an optical path length of the red sub-pixel PR is the longest, an optical path length of the blue sub-pixel PB is the shortest, and an optical path length of the green sub-pixel PG has a middle length. There are various specific methods of making different optical path lengths in the three sub-pixels, but a method of making different layer thicknesses of the hole injection layer 11 is adopted herein based on a viewpoint of suppressing an influence on a resistance value to the utmost. Specifically, if a layer thickness of the hole injection layer 11 of the red sub-pixel PR is set as tHIL-R, a layer thickness of the hole injection layer 11 of the green sub-pixel PG is set as tHIL-G, and a layer thickness of the hole injection layer 11 of the blue sub-pixel PB is set as tHIL-B, there is a relationship of tHIL-R>tHIL-G>tHIL-B.

As described above, the optical path lengths between the reflective layer 6 and the cathode 9 are substantially matched to a quarter of the emission spectrum peak wavelengths of respective colors in all of the R, G, and B sub-pixels in the embodiment.

Therefore, the size relationship of the layer thicknesses of the hole injection layer 11 in each of the sub-pixels is tHIL-R>tHIL-G>tHIL-B.

Accordingly, light emitted from the organic layer 8 is repeatedly reflected in a range of a predetermined optical length between the reflective layer 6 and the cathode 9, and while light of a specific wavelength corresponding to the optical path length resonates and is enhanced, light of a wavelength not corresponding to the optical path lengths is weakened. As a result, a spectrum of light emitted to the outside becomes steep and has a high intensity, and thus brightness and color purity are improved.

In the embodiment, when comparison is performed between red sub-pixels, green sub-pixels, and blue sub-pixels, an optical path length between the reflective layer 6 and the cathode 9 in the flat region 3E is different from an optical path length between the reflective layer 6 and the cathode 9 in the bent region 3F.

Figure 5B:
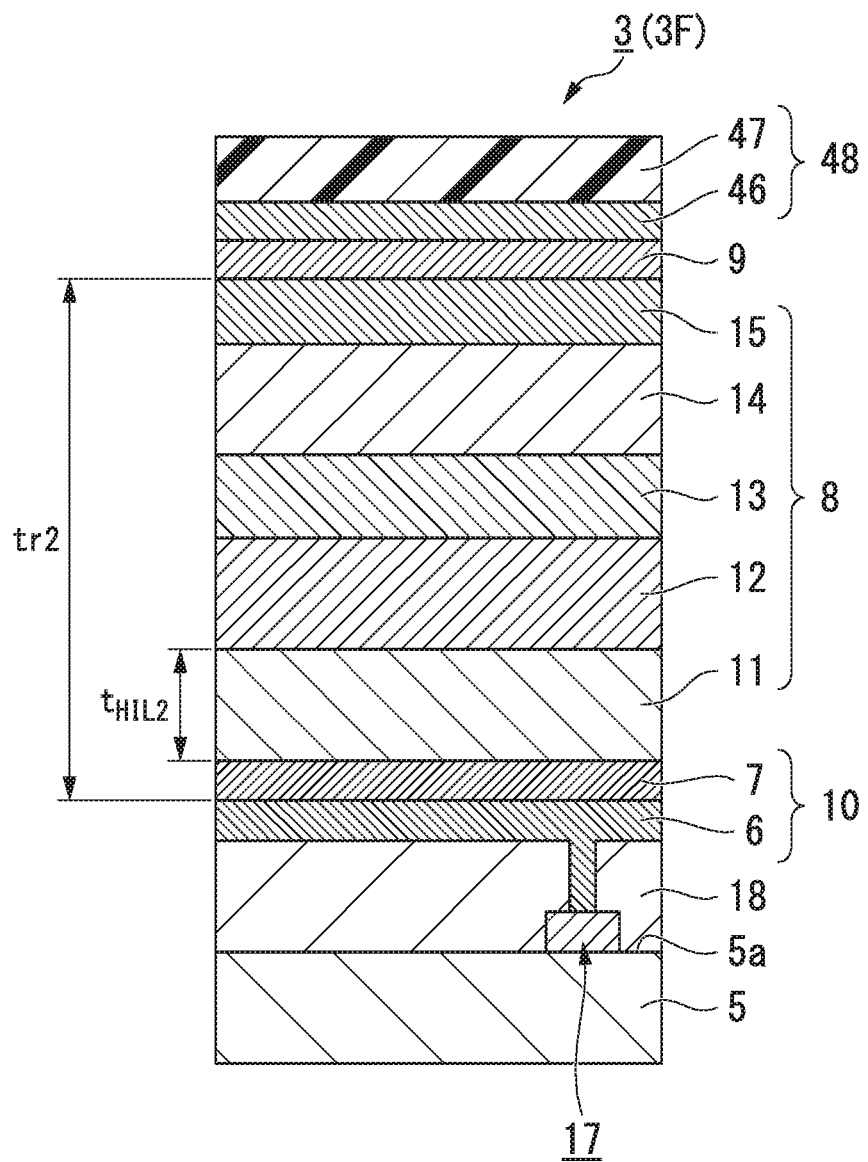
FIG. 5B is a cross-sectional view of a bent region of the organic EL panel.

As shown in FIGS. 5A and 5B, when the optical path length between the reflective layer 6 and the cathode 9 in the flat region 3E is set as tr1 and the optical path length between the reflective layer 6 and the cathode 9 in the bent region 3F is set as tr2, tr1 is not equal to tr2. There are various methods of making different optical path lengths in these two regions, but the method of making different layer thicknesses of the hole injection layer 11 is adopted herein based on the viewpoint of suppressing an influence on a resistance value to the utmost. That is, when a layer thickness of the hole injection layer 11 in the flat region 3E is set as tHIL1 and a layer thickness of the hole injection layer 11 in the bent region 3F is set as tHIL2, tHIL1 is not equal to tHIL2. Particularly, in the embodiment, tr1 is set to be less than tr2 and tHIL1 is set to be less than tHIL2.

When the optical path lengths are set, the optical path length in the bent region 3F is set after the optical path length in the flat region 3E is optimized. A method of setting the optical path length in the bent region 3F includes setting the optical path length so that, for example, a Y value (brightness value) of light emitted in the forward direction from the bent region 3F at the angle θ with respect to the flat region 3E approaches a Y value of light emitted from the flat region 3E in the forward direction. At this time, if only the brightness values in the bent region 3F and the flat region 3E are set, chromaticity deviates from original chromaticity in some cases. In this case, it is necessary to set the optical path length in consideration of a balance with chromaticity. Even if the balance between brightness and chromaticity is somewhat lost, it is also possible to perform a setting which emphasizes brightness or a setting which emphasizes chromaticity.

Specifically, if the optical path length in the bent region 3F at the angle θ with respect to the flat region 3E is set as D(θ), the optical path length in the flat region 3E is set as D(0), and a constant is set as A, the optical path length in the bent region 3F is expressed as shown in the following expression (1). However, the constant A is a value which can be appropriately set in consideration of a balance of brightness and chromaticity, and the like.

$$D(\theta)=D(0)\times\{1+A\times(1-|\cos\theta|)\} \quad (1)$$

Figure 6A:
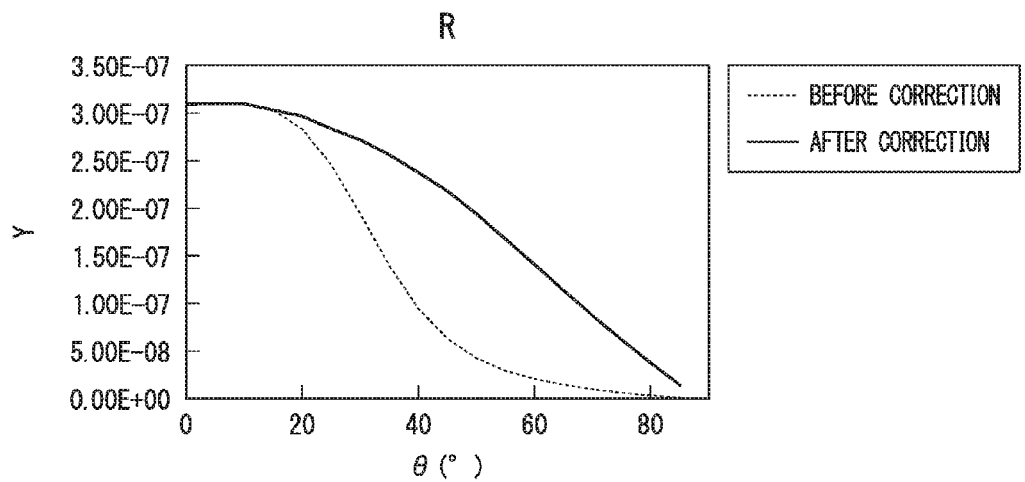
FIG. 6A is a first graph which shows viewing angle brightness characteristics before and after correction of an optical path length of each sub-pixel.
Figure 6B:
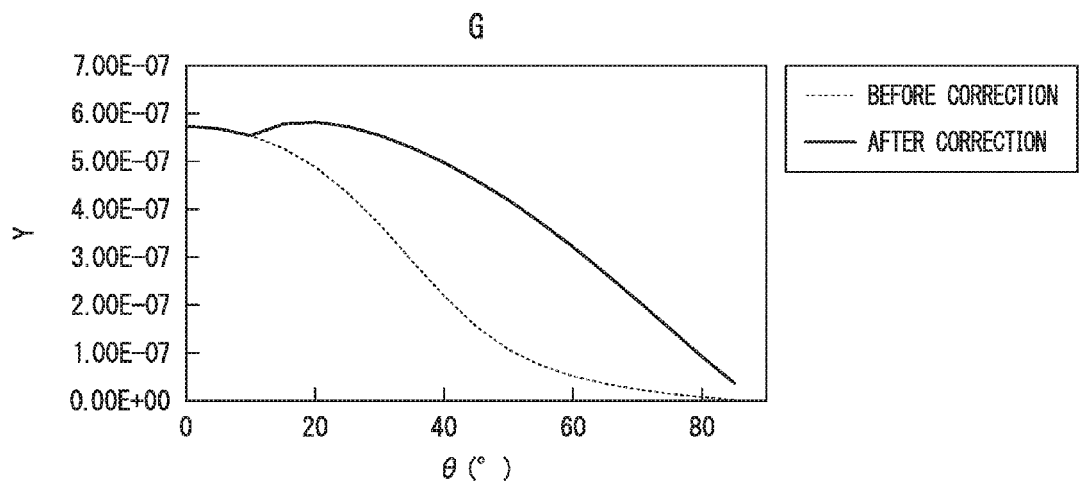
FIG. 6B is a second graph which shows the viewing angle brightness characteristics before and after the correction of an optical path length of each sub-pixel.
Figure 6C:
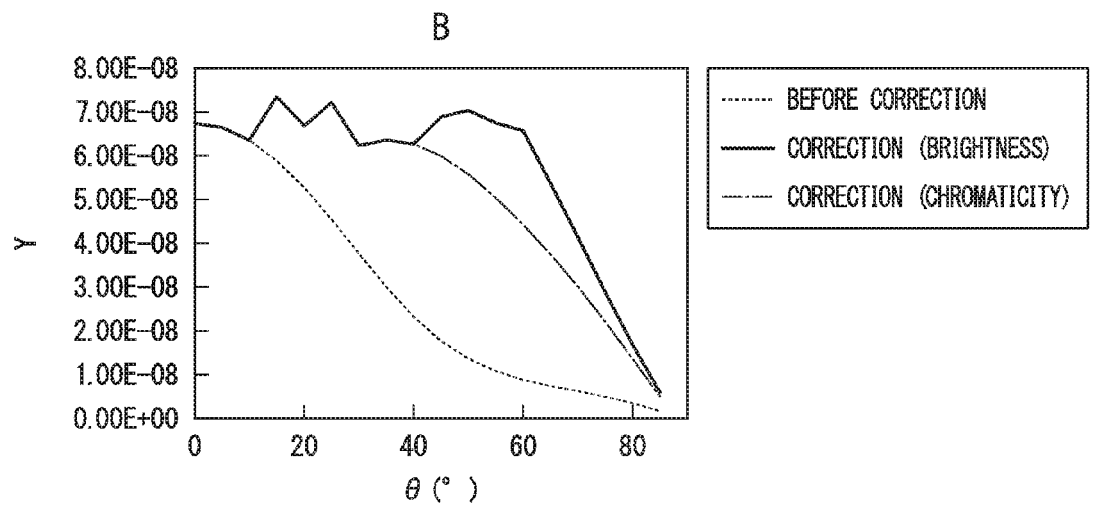
FIG. 6C is a third graph which shows the viewing angle brightness characteristics before and after the correction of an optical path length of each sub-pixel.

As an example, if A in the red sub-pixel is set as 0.35, A in the green sub-pixel is set as 0.4, and A in the blue sub-pixel is set as 0.4, viewing angle characteristics of a brightness value before and after the optical path length in the bent region 3F is corrected are as shown in FIGS. 6A to 6C. FIG. 6A shows viewing angle characteristics of the red sub-pixel, FIG. 6B shows viewing characteristics of the green sub-pixel, and FIG. 6C shows viewing characteristics of the blue sub-pixel. Horizontal axes of FIGS. 6A to 6C represent an angle [°] and vertical axes represent the Y value.

As seen from these graphs, it is possible to suppress a lowering of the brightness value (Y value) in a region with a large polar angle by correcting the optical path length in the bent region 3F. In addition, as shown in FIG. 6C, viewing angle characteristics of the blue sub-pixel are shown by a curve indicated by a solid line when brightness is emphasized, and are shown by a curve indicated by a dashed line when chromaticity is emphasized.

Figure 7A:
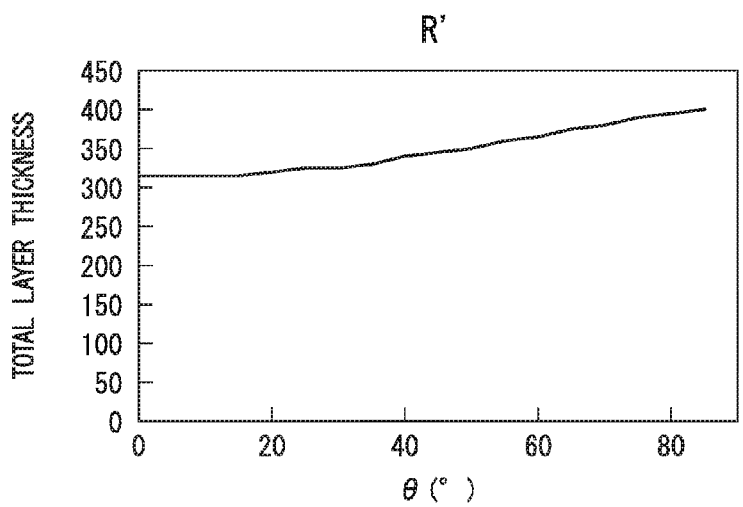
FIG. 7A is a first graph which shows a relationship between a viewing angle and a total layer thickness of each sub-pixel.
Figure 7B:
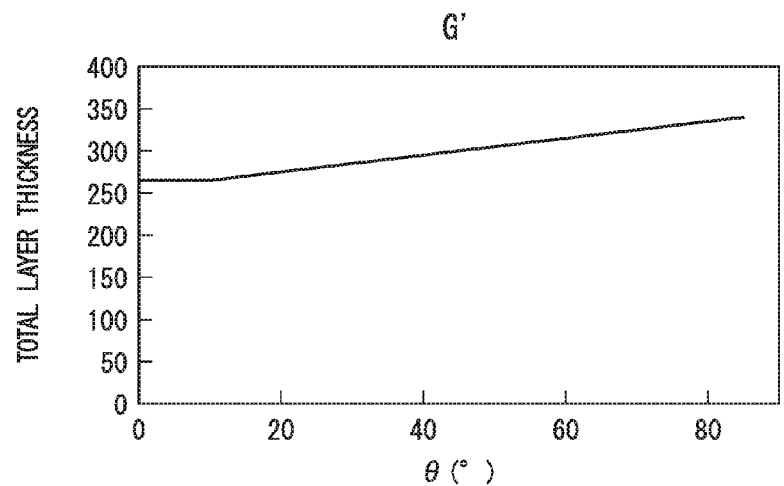
FIG. 7B is a second graph which shows the relationship between a viewing angle and a total layer thickness of each sub-pixel.
Figure 7C:
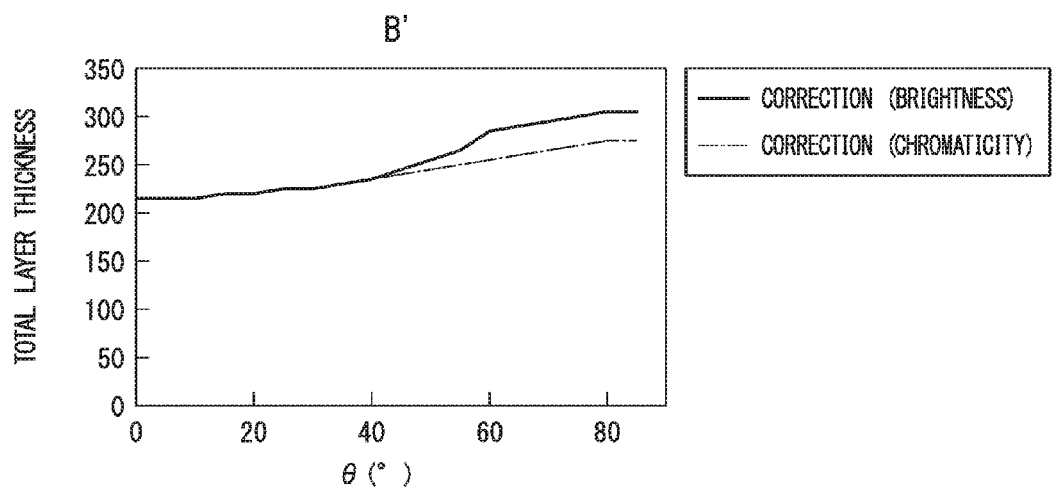
FIG. 7C is a third graph which shows the relationship between a viewing angle and a total layer thickness of each sub-pixel.

In the case of viewing angle characteristics shown in FIGS. 6A to 6C, a relationship of a total layer thickness (optical path length) between the reflective layer 6 and the cathode 9 and the angle θ is as shown in FIGS. 7A to 7C. FIG. 7A shows the relationship in the red sub-pixel, FIG. 7B shows the relationship in the green sub-pixel, and FIG. 7C shows the relationship in the blue sub-pixel. Horizontal axes of FIGS. 7A to 7C represent an angle [°], and vertical axes represent a total layer thickness between the reflective layer 6 and the cathode 9.

As shown in FIG. 7C, the relationship in the blue sub-pixel is shown by a curve indicated by a solid line when brightness is emphasized, and is shown by a curve indicated by a dashed line when chromaticity is emphasized. In FIGS. 7A to 7C, a total layer thickness optimized in the forward direction is 315 nm in the red sub-pixel, 265 nm in the green sub-pixel, and 215 nm in the blue sub-pixel.

An example of layer thicknesses of respective layers which configure the organic layer 8 when the angle θ is set as 45° and a setting is designed with an emphasis on brightness is shown. For example, in the flat region 3E, the total layer thickness between the reflective layer 6 and the cathode 9 in the red sub-pixel is 315 nm, the total layer thickness between the reflective layer 6 and the cathode 9 in the green sub-pixel is 265 nm, and the total layer thickness between the reflective layer 6 and the cathode 9 in the blue sub-pixel is 215 nm. On the other hand, in the bent region 3F, the total layer thickness between the reflective layer 6 and the cathode 9 in the red sub-pixel is 345 nm, the total layer thickness between the reflective layer 6 and the cathode 9 in the green sub-pixel is 300 nm, and the total layer thickness between the reflective layer 6 and the cathode 9 in the blue sub-pixel is 245 nm. In this example, the total layer thickness between the reflective layer 6 and the cathode 9 in a sub-pixel of the same color is set to be thicker in the bent region 3F than in the flat region 3E.

As described above, the organic EL display device 1 of the embodiment has different total layer thicknesses between the reflective layer 6 and the cathode 9 corresponding to sub-pixels of the same color in the flat region 3E and the bent region 3F. Accordingly, viewing angle characteristics in the flat region 3E are close to viewing angle characteristics in the bent region 3F when the organic EL display device 1 is viewed in any direction. As a result, it is possible to realize a bent type organic EL display device 1 which has less lowering of brightness and chromaticity of a displayed image, regardless of a viewing direction of a user.

Second Embodiment

Hereinafter, a second embodiment of the present invention will be described using FIGS. 8, 9A, and 9B.

An organic EL display device of the second embodiment is an example of the top-emission type organic EL display device in which the microcavity structure is adopted in the same manner as in the first embodiment.

Figure 8:
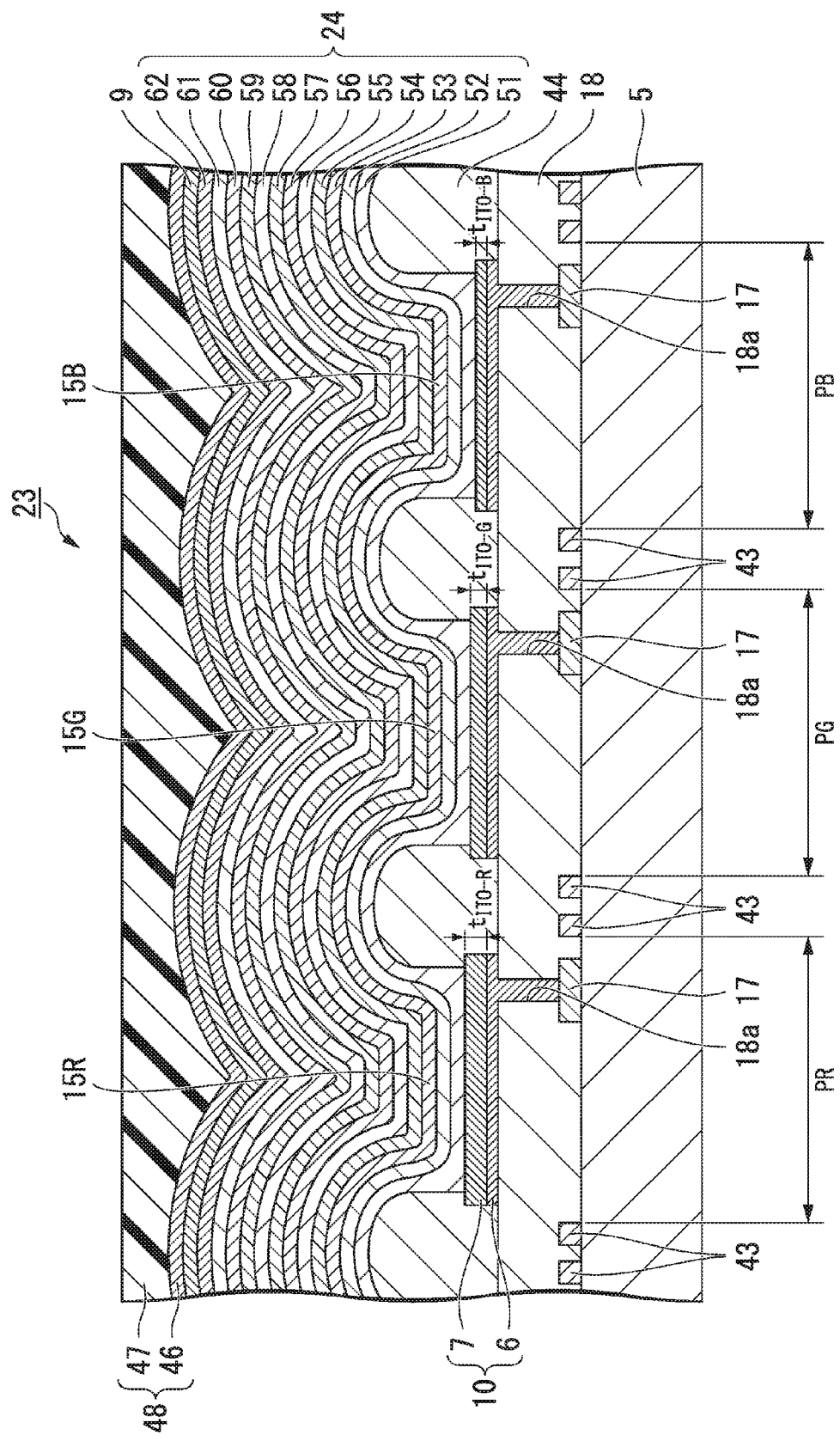
FIG. 8 is a cross-sectional view of a flat region of an organic EL display device of a second embodiment of the present invention.

FIG. 8 is a cross-sectional view showing the organic EL display device of the second embodiment. FIG. 9A is a cross-sectional view of a flat region, and FIG. 9B is a cross-sectional view of a bent region.

Figure 9A:
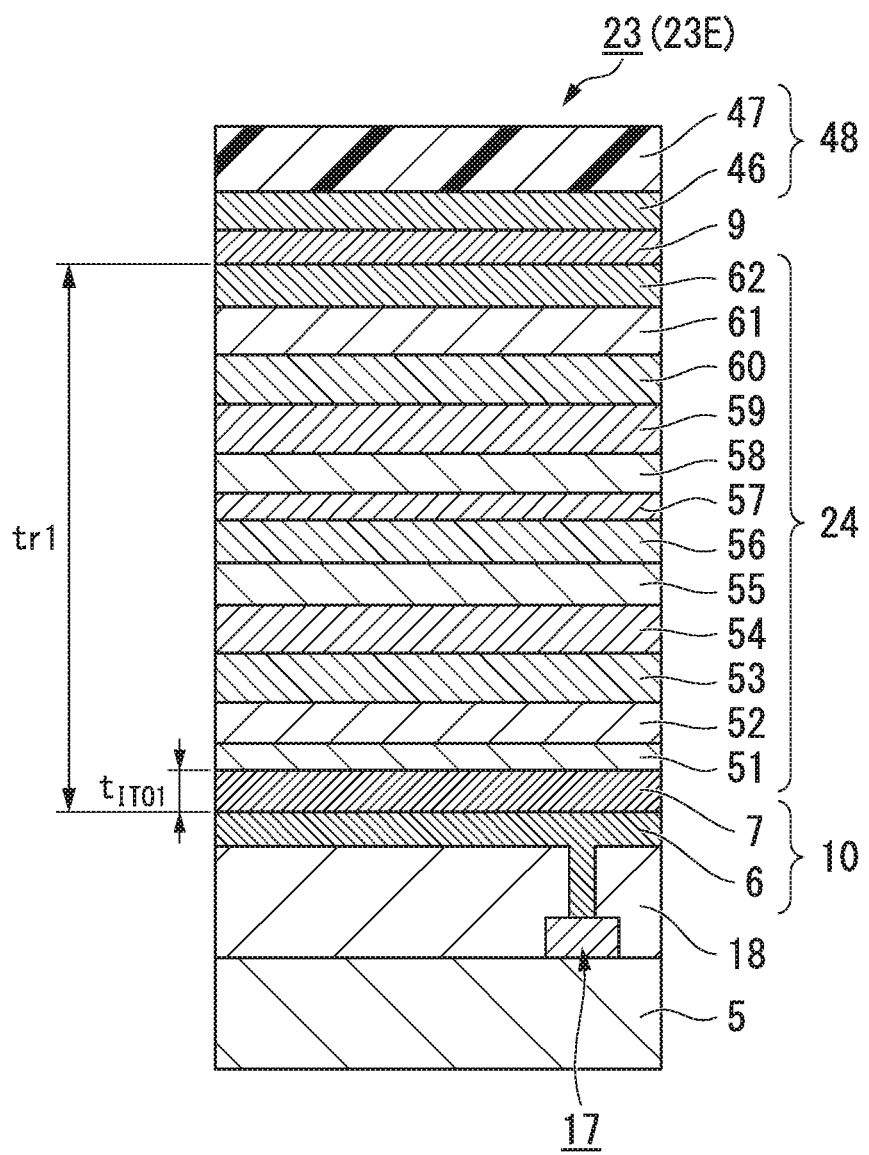
FIG. 9A is a cross-sectional view of a flat region of the organic EL display device.
Figure 9B:
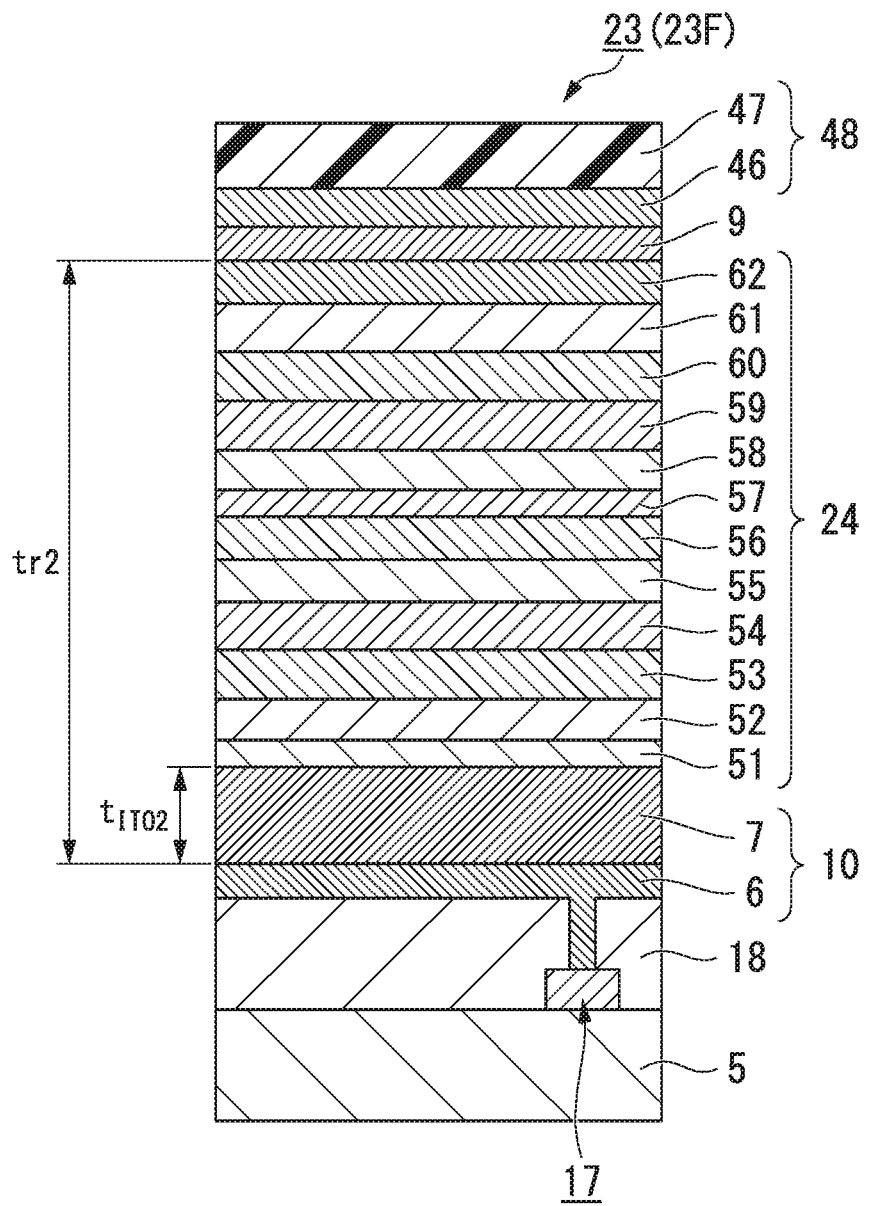
FIG. 9B is a cross-sectional view of a bent region of the organic EL display device.

In FIGS. 8, 9A, and 9B, the same components as in FIGS. 4, 5A, and 5B used in the first embodiment will be denoted by the same reference numerals, and description thereof will be omitted.

In the organic EL panel of the first embodiment, a light-emitting layer made of a light-emitting material which emits light of a particular color is provided in a sub-pixel of that color. That is, a light-emitting material which emits red light, a light-emitting material which emits green light, and a light-emitting material which emits blue light are each applied to the sub-pixel of the corresponding color. In contrast, as shown in FIG. 8, in the case of an organic EL panel 23 of the embodiment, an organic layer 24 is commonly provided in three R, G, and B sub-pixels. Accordingly, light itself emitted from the organic layer 24 is white light in any sub-pixel. In other words, all of the light-emitting material which emits red light, the light-emitting material which emits green light, and the light-emitting material which emits blue light are commonly provided in all of the sub-pixels. Therefore, in the second embodiment, unlike the first embodiment, more functional layers are laminated on the organic layer 24.

As shown in FIG. 8, the organic layer 24 is configured of a laminated film in which a hole injection layer 51, a hole transport layer 52, a first light-emitting layer 53, an electron transport layer 54, intermediate charge generation layers 55 and 56, a hole injection layer 57, a hole transport layer 58, an electron blocking layer 59, a second light-emitting layer 60, an electron transport layer 61, and an electron injection layer 62 are laminated from the substrate 5 side. In the present embodiment, unlike the first embodiment, a first light-emitting layer 53 includes the light-emitting material which emits green light and the light-emitting material which emits red light. The second light-emitting layer 60 includes the light-emitting material which emits blue light. The intermediate charge generation layers 55 and 56 are configured of, for example, a layer 55 containing an n-type dopant in a phthalocyanine-based organic compound host and a layer 56 containing a p-type dopant in a phthalocyanine-based organic compound host. The intermediate charge generation layers 55 and 56 have a function of increasing brightness with respect to a supply current to increase current efficiency. Configuration materials of the hole injection layer 51, the hole transport layer 52, the electron transport layer 54, the hole injection layer 57, the hole transport layer 58, the electron blocking layer 59, the electron transport layer 61, and the electron injection layer 62 are the same as in the first embodiment. The organic layer 24 is commonly provided in the R, G, and B sub-pixels. The organic EL panel 23 of the embodiment is a so-called tandem-type organic EL panel, and white light can be obtained with the configuration of the organic layer 24 described above. In addition, configuration of a lower layer side than the reflective layer 6 and configuration of the cathode 9 are the same as in the first embodiment.

In the organic EL panel 3 in the embodiment, the microcavity structure is adopted in the same manner as in the first embodiment. In other words, in the embodiment, a total layer thickness (optical path length) between the reflective layer 6 and the cathode 9 in a red sub-pixel, a total layer thickness (optical path length) between the reflective layer 6 and the cathode 9 in a green sub-pixel, and a total layer thickness (optical path length) between the reflective layer 6 and the cathode 9 in a blue sub-pixel are different from each other. There are various specific methods of varying the optical path lengths in three sub-pixels, but a method of varying a layer thickness of the transparent electrode layer 7 made of ITO and the like is adopted herein. Specifically, if a layer thickness of the transparent electrode layer 7 in a red sub-pixel PR is set as tITO-R, a layer thickness of the transparent electrode layer 7 in a green sub-pixel PG is set as tITO-G, and a layer thickness of the transparent electrode layer 7 in a blue sub-pixel PB is set as tITO-B, there is a relationship of tITO-R>tITO-G>tITO-B.

Accordingly, light of a specific color (wavelength) in a specific sub-pixel is enhanced, and white light emitted from the common organic layer 24 in three sub-pixels is converted into light of a color corresponding to a sub-pixel for each sub-pixel. In this manner, red light is emitted from the red sub-pixel, green light is emitted from the green sub-pixel, and blue light is emitted from the blue sub-pixel.

Furthermore, when comparison is performed between the red sub-pixels, the green sub-pixels, and the blue sub-pixels, an optical path length between the reflective layer 6 and the cathode 9 in a flat region 23E is different from an optical path length between the reflective layer 6 and the cathode 9 in a bent region 23F. As shown in FIGS. 9A and 9B, when the optical path length between the reflective layer 6 and the cathode 9 in the flat region 23E is set as tr1 and the optical path length between the reflective layer 6 and the cathode 9 in the bent region 23F is set as tr2, tr1 is not equal to tr2.

There are various methods of varying the optical path lengths of these two regions, but a method of varying a layer thickness of the transparent electrode layer 7 made of ITO and the like is adopted herein. In other words, when a layer thickness of the transparent electrode layer 7 in the flat region 23E is set as tITO1 and a layer thickness of the transparent electrode layer 7 in the bent region 23F is set as tITO2, tITO1 is not equal to tITO2. In particular, tr1 is set to be less than tr2 and tITO1 is set to be less than tITO2 in the embodiment.

In the present embodiment, it is possible to realize a bent type organic EL display device 23 which has less lowering of brightness and chromaticity of a displayed image, regardless of a viewing direction of a user.

[Modification of Second Embodiment]

Figure 10:
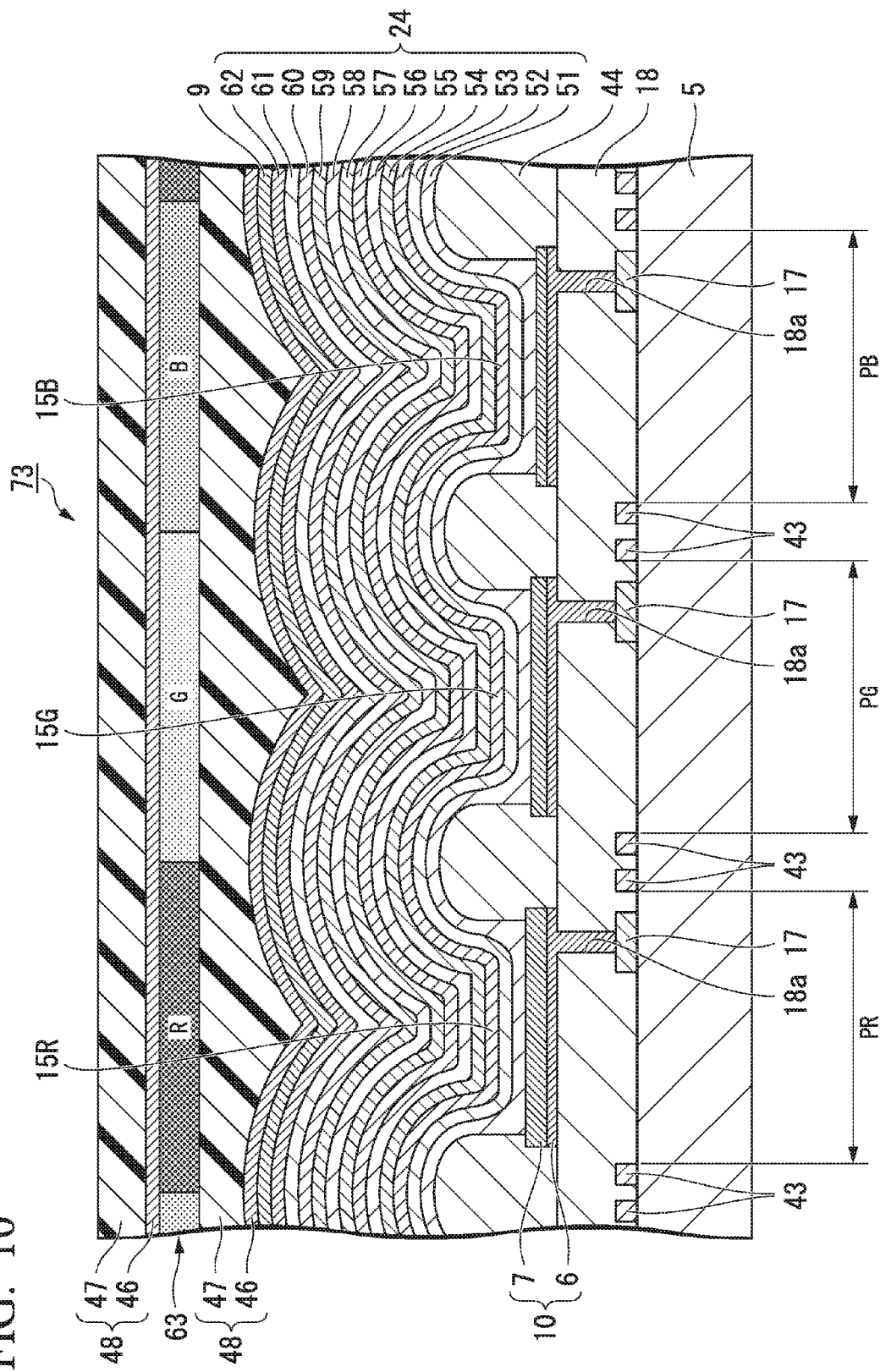
FIG. 10 is a cross-sectional view which shows a modification of the organic EL display device of the second embodiment of the present invention.

FIG. 10 is a cross-sectional view which shows an organic EL panel 73 in a modification of the second embodiment.

The organic EL panel 73 of the modification has a configuration in which a color filter 63 is provided in an upper layer of the protection layer 48 of the organic EL panel 23 of the second embodiment shown in FIG. 8, and a protection layer 48 is further provided in an upper layer of the color filter 63. The color filter 63 includes a red color filter disposed in a red sub-pixel, a green color filter disposed in a green sub-pixel, and a blue color filter disposed in a blue sub-pixel.

The organic EL panel 73 converts white light into each of R, G, and B color light with the microcavity structure. In addition, the color filter 63 corresponding to a sub-pixel of each color is provided, and thereby it is possible to increase color purity.

Third Embodiment

Hereinafter, a third embodiment of the present invention will be described using FIG. 11.

An organic EL display device of the third embodiment is an example of the top-emission type organic EL display device in which the microcavity structure is adopted as in the first embodiment.

Figure 11:
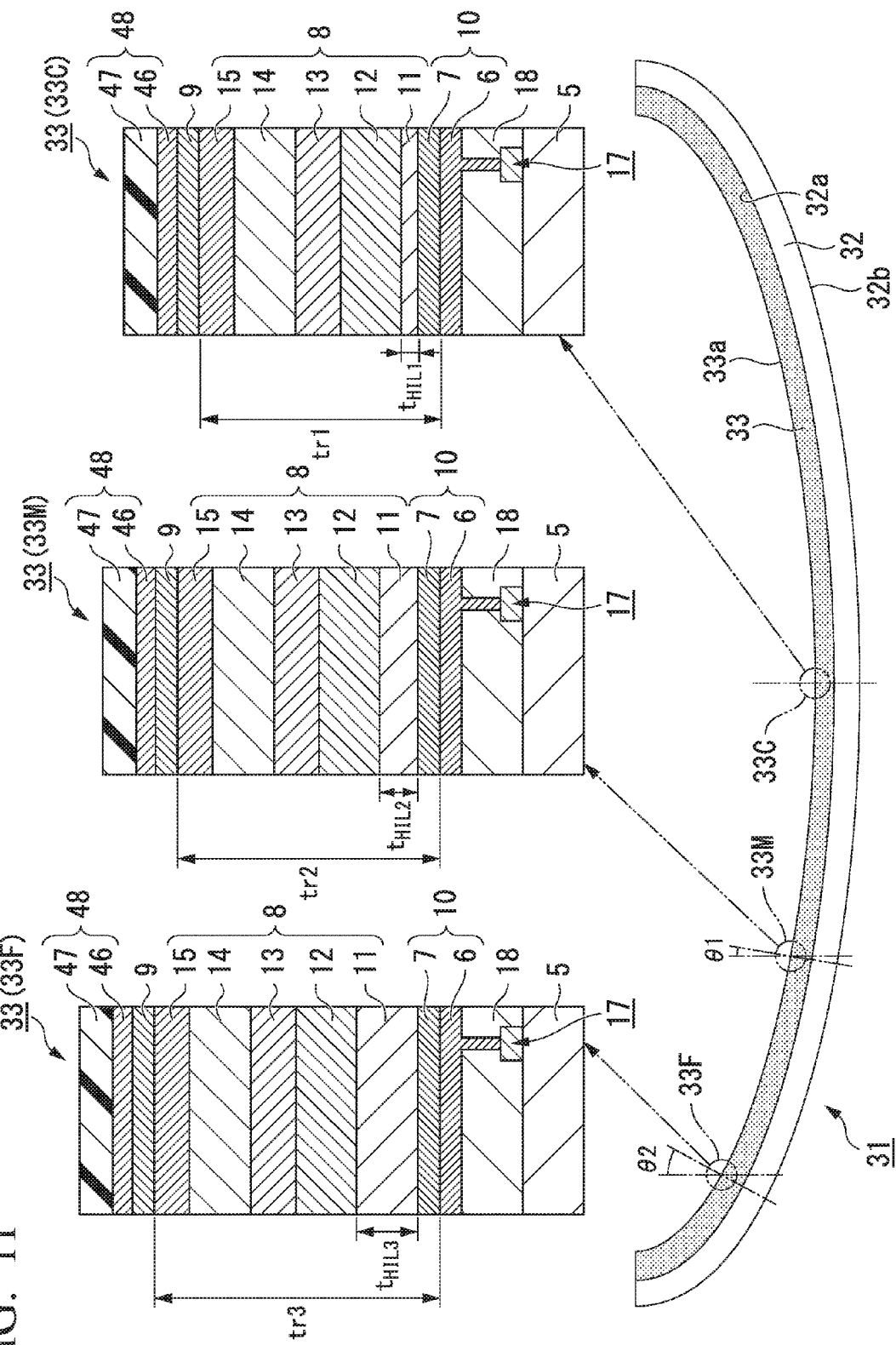
FIG. 11 is a cross-sectional view of each unit of an organic EL display device of a third embodiment of the present invention.

FIG. 11 is a diagram which shows a configuration of an organic EL panel of the third embodiment and a cross-sectional structure of each region.

In FIG. 11, the same components as in FIGS. 5A and 5B used in the first embodiment are denoted by the same reference numerals, and description thereof will be omitted.

While the organic EL display device in the first and second embodiments is a bent type, an organic EL display device 31 of the present embodiment is a curved surface type organic EL display device which is curved as shown in FIG. 11. The organic EL display device 31 includes a housing 32 and an organic EL panel 33. The housing 32 is curved and has a concave surface 32a and a convex surface 32b of a gently curved surface type. The organic EL panel 33 is curved in the same manner as the housing 32, and is installed along the concave surface 32a of the housing 32. A configuration of the organic layer 8 of the organic EL panel 33 is the same as in the first embodiment.

Hereinafter, three points are selected from any position of the organic EL panel 33, a region near a center of the organic EL panel 33 is referred to as a central region 33C, a region in the periphery of the organic EL panel is referred to as a peripheral region 33F, and a region in the middle of the central region 33C and the peripheral region 33F is referred to as an intermediate region 33M. The organic EL panel 33 includes the central region 33C in which a normal direction of a display surface 33a faces a vertical direction, the intermediate region 33M in which the normal direction of the display surface 33a faces a direction inclined from the vertical direction by an angle θ1, and the peripheral region 33F in which the normal direction of the display surface 33a faces a direction inclined from the vertical direction by an angle θ2. A relationship between the angle θ1 and the angle θ2 is that θ1 is smaller than θ2.

In the embodiment, a total layer thickness (optical path length) between the reflective layer 6 and the cathode 9 in a red sub-pixel, a total layer thickness (optical path length) between the reflective layer 6 and the cathode 9 in a green sub-pixel, and a total layer thickness (optical path length) between the reflective layer 6 and the cathode 9 in a blue sub-pixel are different from each other. The organic EL panel 33 has the microcavity structure. Accordingly, light of a specific color (wavelength) is enhanced in the specific sub-pixel, red light is emitted from the red sub-pixel, green light is emitted from the green sub-pixel, and blue light is emitted from the blue sub-pixel.

Furthermore, when comparison is performed between red sub-pixels, green sub-pixels, and blue sub-pixels, an optical path length between the reflective layer 6 and the cathode 9 in the central region 33C, an optical path length between the reflective layer 6 and the cathode 9 in the intermediate region 33M, and an optical path length between the reflective layer 6 and the cathode 9 in the peripheral region 33F are different from each other. As shown in FIG. 11, when the optical path length between the reflective layer 6 and the cathode 9 in the central region 33C is set as tr1, the optical path length between the reflective layer 6 and the cathode 9 in the intermediate region 33M is set as tr2, and the optical path length between the reflective layer 6 and the cathode 9 in the peripheral region 33F is set as tr3, tr1, tr2, and tr3 are not equal to one another. Particularly, in the embodiment, tr1<tr2<tr3.

There are various methods of varying the optical path lengths in these three regions, but, in the same manner as in the first embodiment, a method of varying a layer thickness of the hole injection layer 11 is adopted herein. In other words, when a layer thickness of the hole injection layer 11 in the central region 33C is set as tHIL1, a layer thickness of the hole injection layer 11 in the intermediate region 33M is set as tHIL2, and a layer thickness of the hole injection layer 11 in the peripheral region 33F is set as tHIL3, the layer thicknesses tHIL1, tHIL2, and tHIL3 are not equal to one another. Particularly, in the embodiment, tHIL1<tHIL2<tHIL3.

In the embodiment, the same effect is obtained as in the first and the second embodiments that it is also possible to realize a curved-surface type organic EL display device 31 which has less lowering of brightness and chromaticity of a displayed image, regardless of a viewing direction of a user.

Here, description is provided by selecting any three points of the organic EL panel 33, but the layer thickness described above may also change stepwise to have, for example, three types of layer thicknesses in the organic EL panel. Alternatively, the layer thickness described above may also change in a continuous and gentle manner.

Here, different optical path lengths between a reflective electrode (reflective layer) and a cathode (semi-transmissive reflective layer) are simply equivalent to different film thicknesses between the reflective electrode (reflective layer) and the cathode (semi-transmissive reflective layer). A difference in the optical path lengths between the reflective electrode (reflective layer) and the cathode (semi-transmissive reflective layer) can be determined by a measurement using, for example, a scanning electron microscope or the like.

The technical concept of the present invention is not limited to the above embodiment, and may be variously modified without departing from the scope of the present invention.

For example, the first embodiment shows an example in which optical path lengths between the reflective electrode (reflective layer) and the cathode (semi-transmissive reflective layer) in sub-pixels of different colors of the microcavity structure are adjusted by a layer thickness of the hole injection layer, and optical path lengths between the reflective electrode (reflective layer) and the cathode (semi-transmissive reflective layer) in a sub-pixel of the same color in a first region and a second region are adjusted by the layer thickness of the hole injection layer. In addition, the second embodiment shows an example in which the optical path lengths between the reflective electrode (reflective layer) and the cathode (semi-transmissive reflective layer) in sub-pixels of different colors of the microcavity structure are adjusted by a layer thickness of the transparent electrode layer, and furthermore the optical path lengths between the reflective electrode (reflective layer) and the cathode (semi-transmissive reflective layer) in the sub-pixel of the same color in the first region and the second region are adjusted by the layer thickness of the transparent electrode layer. However, adjustment means for each of the optical path lengths is not only the two types described above, and it is possible to adopt the combination shown in Table 1 below.

TABLE 1

| Combination of layers with varying thicknesses | | | | |
|---|---|---|---|---|
| Optical path lengths between the reflective layer and the semi-transmissive reflective layer in sub-pixels of different colors | Hole injection layer | Transparent electrode | Hole injection layer | Transparent electrode |
| Optical path lengths between the reflective layer and the semi-transmissive reflective layer in sub-pixels of the same color in different regions | Hole injection layer | Transparent electrode | Transparent electrode | Hole injection layer |

In other words, as shown in Table 1, adjustments by a layer thickness of each of the hole injection layer and the transparent electrode layer may also be combined so that one of the optical path lengths in sub-pixels of different colors of the microcavity structure and the optical path lengths in a sub-pixel of the same color in the first region and the second region are adjusted by the layer thickness of the hole injection layer and the other is adjusted by the layer thickness of the transparent electrode layer.

Moreover, the above embodiments show an example in which the reflective electrode which functions as a reflective layer on a lower layer side and an anode are laminated, but the reflective electrode on a lower layer side may be apart from the anode. Furthermore, the above embodiments give an example in which the cathode serves as a second electrode and the semi-transmissive reflective layer, but the second electrode and the semi-transmissive reflective layer may be separately provided. In addition, a specific configuration, such as a material, number, disposition, manufacture method, or the like, of each portion of the organic EL display device exemplified in the above embodiments is not limited to the above embodiments, and can be appropriately modified.

INDUSTRIAL APPLICABILITY

Some aspects of the present invention are applicable to an organic EL display device or an electronic apparatus including the organic EL display device.

DESCRIPTION OF THE REFERENCE SYMBOLS 1, 31 Organic EL display device
1a Display surface
3, 23, 33, 73 Organic EL panel
3a, 33a Display surface
3E, 23E Flat region (first region)
3F, 23F Bent region (second region)
5 Substrate
5a First surface
6 Reflective layer
10 Anode (first electrode)
8, 24 Organic layer
9 Cathode (second electrode, semi-transmissive reflective layer)
11, 51, 57 Hole injection layer
13 Light-emitting layer
53 First light-emitting layer
60 Second light-emitting layer
33C Central region (first region)
33M Intermediate region (second region)
33F Peripheral region (third region)

The invention claimed is:

1. An organic electroluminescent display device comprising:
   a substrate;
   a first electrode provided on the substrate;
   an organic layer comprising a light-emitting layer provided above the first electrode on the substrate;
   a second electrode provided above the organic layer on the substrate;
   a reflective layer and a semi-transmissive reflective layer provided to interpose the organic layer on the substrate; and
   a plurality of sub-pixels of different colors in which light emitted from the organic layer is repeatedly reflected between the reflective layer and the semi-transmissive reflective layer such that light of a specific wavelength is enhanced and emitted;
   wherein the substrate has at least a first region in which a first normal direction of a display surface faces a first direction and a second region in which a second normal direction of the display surface faces a second direction different from the first direction by being bent or curved,
   a first optical path length between the reflective layer and the semi-transmissive reflective layer in a first sub-pixel of a predetermined color of the first region is different from a second optical path length between the reflective layer and the semi-transmissive reflective layer in a second sub-pixel of a same color as the predetermined color of the second region,
   the first region is formed at a central region of the substrate, and
   the second region is formed at a peripheral region of the substrate.

2. The organic electroluminescent display device according to claim 1,
   wherein the organic layer comprises a hole injection layer, and a first layer thickness of the hole injection layer in the first region is different from a second layer thickness of the hole injection layer in the second region such that the first optical path length is different from the second optical path length.

3. The organic electroluminescent display device according to claim 2,
wherein, when the first optical path length is set as tr1 and the second optical path length is set as tr2, tr1<tr2, and
when the first layer thickness is set as tHIL1 and the second layer thickness is set as tHIL2, tHIL1<tHIL2.

4. The organic electroluminescent display device according to claim 1,
wherein the first electrode comprises a transparent electrode layer, and
a first layer thickness of the transparent electrode layer in the first region is different from a second layer thickness of the transparent electrode in the second region such that the first optical path length is different from the second optical path length.

5. The organic electroluminescent display device according to claim 4,
wherein, when the first optical path length is set as tr1 and the second optical path length is set as tr2, tr1<tr2, and
when the first layer thickness is set as tITO1 and the second layer thickness is set as tITO2, tITO1<tITO2.

6. The organic electroluminescent display device according to claim 1,
wherein a light-emitting layer that emits light of a color corresponding to the first sub-pixel is provided in the first sub-pixel among the plurality of sub-pixels.

7. The organic electroluminescent display device according to claim 6,
wherein third and fourth optical path lengths between the reflective layer and the semi-transmissive reflective layer corresponding to third and fourth sub-pixels of different colors are different from each other.

8. The organic electroluminescent display device according to claim 7,
wherein the organic layer comprises a hole injection layer, and
first and second layer thicknesses of the hole injection layer are different for third and fourth sub-pixels of different colors such that third and fourth optical path lengths are different for the third and fourth sub-pixels.

9. The organic electroluminescent display device according to claim 7,
wherein the first electrode comprises a transparent electrode layer, and
first and second layer thicknesses of the transparent electrode layer are different for third and fourth sub-pixels of different colors such that third and fourth optical path lengths are different for the third and fourth sub-pixels.

10. The organic electroluminescent display device according to claim 1,
wherein a plurality of light-emitting layers that emit light of different colors are commonly provided over the plurality of sub-pixels, and
third and fourth optical path lengths between the reflective layer and the semi-transmissive reflective layer corresponding to third and fourth sub-pixels of different colors are different from each other.

11. The organic electroluminescent display device according to claim 1,
wherein the substrate is curved, and the first optical path length in the central region is different from the second optical path length in the peripheral region.

12. The organic electroluminescent display device according to claim 11,
wherein, when the first optical path length corresponding to the first region is set as tr1, a third optical path length in an intermediate region corresponding to the second region, which is a region between the peripheral region and the central region of the substrate, is set as tr2, and the second optical path length corresponding to a third region is set as tr3, tr1<tr2<tr3, and
the organic layer comprises a hole injection layer, and when a first layer thickness of the hole injection layer in the first region is set as tHIL1, a second layer thickness of the hole injection layer in the second region is set as tHIL2, and a third layer thickness of the hole injection layer in the third region is set as tHIL3, tHIL1<tHIL2<tHIL3.

13. The organic electroluminescent display device according to claim 1,
wherein a first brightness is lower than a second brightness in the display surface at the first region, the second brightness being of the first normal direction, the first brightness being of a third direction which is inclined from the first normal direction, and
a third brightness is higher than a fourth brightness for at least one color among a predetermined colors in the display surface at the second region, the fourth brightness being of the second normal direction, the third brightness being of at least one direction which is inclined from the second normal direction.

14. The organic electroluminescent display device according to claim 1,
wherein more an angle between the first and second normal directions becomes large, more the second optical path length becomes long.

* * * * *